(12) United States Patent
Shen et al.

(10) Patent No.: US 8,969,205 B2
(45) Date of Patent: Mar. 3, 2015

(54) DOUBLE PATTERNING VIA TRIANGULAR SHAPED SIDEWALL SPACERS

(71) Applicant: GLOBALFOUNDRIES, Inc., Grand Cayman, KY (US)

(72) Inventors: HongLiang Shen, Clifton Park, NY (US); Dae-Han Choi, Loudonville, NY (US); Dae Geun Yang, Watervliet, NY (US); Jung Yu Hsieh, Saratoga Springs, NY (US)

( * ) Notice: Subject to any disclaimer, the term of this patent is extended or adjusted under 35 U.S.C. 154(b) by 24 days.

(21) Appl. No.: 13/852,496

(22) Filed: Mar. 28, 2013

(65) Prior Publication Data

US 2014/0291735 A1    Oct. 2, 2014

(51) Int. Cl.
| | |
|---|---|
| *H01L 21/311* | (2006.01) |
| *H01L 21/02* | (2006.01) |
| *H01L 29/423* | (2006.01) |
| *H01L 29/78* | (2006.01) |

(52) U.S. Cl.
CPC .... *H01L 21/02348* (2013.01); *H01L 29/42364* (2013.01); *H01L 29/78* (2013.01)
USPC .......................................................... 438/696

(58) Field of Classification Search
None
See application file for complete search history.

(56) References Cited

U.S. PATENT DOCUMENTS

| | | | |
|---|---|---|---|
| 5,686,363 A | 11/1997 | Tabara | |
| 6,583,063 B1 | 6/2003 | Khan et al. | |
| 2005/0029221 A1* | 2/2005 | Chang et al. | 216/2 |
| 2006/0216923 A1* | 9/2006 | Tran et al. | 438/622 |
| 2008/0057692 A1* | 3/2008 | Wells et al. | 438/597 |
| 2011/0111596 A1* | 5/2011 | Kanakasabapathy | 438/694 |

OTHER PUBLICATIONS

Minoo Mirsaeedi, EDA Solutions for Double Patterning Lithography, PHD thesis, Waterloo, Ontario Canada 2012.*

* cited by examiner

*Primary Examiner* — Evan Pert
*Assistant Examiner* — Herve Assouman
(74) *Attorney, Agent, or Firm* — Wayne F. Reinke, Esq.; Heslin Rothenberg Farley & Mesiti P.C.

(57) ABSTRACT

An intermediate semiconductor structure in fabrication includes a silicon semiconductor substrate, a hard mask of silicon nitride (SiN) over the substrate and a sacrificial layer of polysilicon or amorphous silicon over the hard mask. The sacrificial layer is patterned into sidewall spacers for mandrels of a filler material substantially different in composition from the sidewall spacers, such as a flowable oxide. The mandrels are removed such that the sidewall spacers have vertically tapered inner and outer sidewalls providing a rough triangular shape. The rough triangular sidewall spacers are used as a hard mask to pattern the SiN hard mask below.

16 Claims, 8 Drawing Sheets

DOUBLE PATTERNING VIA TRIANGULAR SHAPED SIDEWALL SPACERS

BACKGROUND OF THE INVENTION

1. Technical Field

The present invention generally relates to semiconductor devices and methods of increasing feature density in fabricating semiconductor devices. More particularly, the invention relates to double patterning by creating a temporary mask of triangular sidewall spacers.

2. Background Information

In fabricating integrated circuits (ICs) or semiconductor devices, the density of components continues to increase to achieve greater functionality and reduced manufacturing costs. One such technique, commonly known as double patterning technique, has been developed to increase the feature density than what is currently possible with standard lithographic techniques. Two principle approaches utilized in the double patterning technique are double exposure and sidewall image transfer.

In the double exposure approach, the substrate is exposed using standard lithographic pattern and etch techniques either simultaneously or alternately, in a series of steps, to increase the feature density. In the more preferred, sidewall image transfer (SIT) approach, however, lithography is used as a starting point to pattern lines, followed by materials processing to produce smaller, narrower lines, thus avoiding the fundamental physical limits of resolution. In the SIT approach, a film on the sidewall of a line structure, referred to in that art as a mandrel, is used as the template from which to pattern the structure underneath it. When the mandrel is removed, the sidewall remains, and performs a function equivalent to what photoresist does for patterning underlying substrates. The SIT approach is sometimes referred to as a self-aligned double patterning (SADP) process, due to the doubling of the number of lined structures from the number of mandrels.

However, the current SADP approaches are cost prohibitive, particularly as a result of processes employed for the spacer deposition along with the increase in production cycle time due to the additional operations performed to pattern a particular layer. Furthermore, the current SADP approaches pose patterning difficulties due to the size of mandrels formed.

Hence, there continues to be a need for enhanced techniques to increase the feature density.

SUMMARY OF THE INVENTION

The shortcomings of the prior art are overcome and additional advantages are provided through the provision, in one aspect, of a method of image transfer using triangular shaped sidewall spacers. The method includes providing an intermediate semiconductor structure, the structure including a semiconductor substrate and a sacrificial layer of a dummy gate material above the substrate. The method further includes creating sidewall spacers in the sacrificial layer, and vertically tapering inner and outer sidewalls of the spacers, the sidewall spacers having a rough triangular shape with a pointed tip.

In accordance with another aspect, an intermediate semiconductor structure is provided. The structure includes a semiconductor substrate, and a hard mask above the semiconductor substrate. The hard mask includes a plurality of sidewall spacers made of a dummy gate material, each sidewall spacer having vertically tapered inner and outer sidewalls providing a rough triangular shape with a pointed tip.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures designate the same or similar components.

Figure 1:
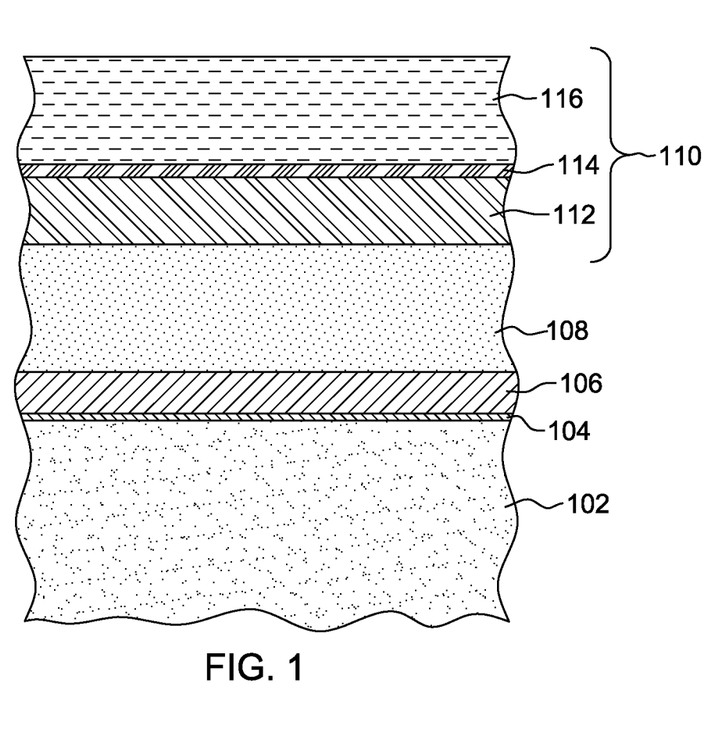
FIG. 1 is a cross-sectional elevational view of one example of an intermediate semiconductor structure including a lithographic stack above a sacrificial layer, in accordance with one or more aspects of the present invention.

FIG. 1 is a cross-sectional view of one example of an intermediate semiconductor structure, generally denoted by 100, obtained during an intermediate stage of semiconductor fabrication. At the stage of fabrication depicted in FIG. 1, the intermediate structure 100 includes a substrate 102, for example, a semiconductor substrate, for example, bulk silicon. In one example, the substrate 102 may be any silicon-containing substrate including, but not limited to, Si, single crystal Si, polycrystalline Si, amorphous Si, silicon-on-insulator substrates, silicon-on-nothing and the like. A thin oxide layer 104 (also referred to as pad oxide layer), which may alleviate the stresses generated between the silicon substrate 102 and the subsequent hard mask 106, may be disposed over the substrate 102. In a specific example, the oxide layer 104 may include silicon dioxide ($SiO_2$) and may be thermally grown on the substrate 102, or deposited by processes, for example, chemical vapor deposition.

Hard mask 106 may be deposited over the oxide layer 104 by performing a suitable deposition process, for example, chemical-vapor deposition (CVD), physical vapor deposition (PVD) or the like. The hard mask layer 106 may eventually be patterned to form a deep trench isolation (DTI) and may include a material, for example, silicon nitride (SiN). A sacrificial layer 108 of a dummy gate material may be deposited over the hard mask 106 and may include, for example, an amorphous-silicon (a-Si) or polycrystalline silicon, which as known, may be used to hold the gate position for subsequent fabrication. The thickness of the sacrificial layer may be about 70 nanometers to about 100 nanometers.

Continuing further with the example of FIG. 1, the intermediate structure 100 further includes a lithographic stack 110 over the sacrificial layer 108, the lithographic stack 110 including an organic planarizing layer (OPL) 112, an anti-reflective coating material layer 114 and a layer of photo resist 116. The organic planarizing layer 112, which is used to transfer a pattern from the overlying photoresist layer 116 in subsequent lithography processing, may be formed using conventional spin-coating processes. In one example, organic planarizing layer 112 may be any of those conventionally employed during a pattern transfer process and may include an organic polymer, for example, polyacrylate resin, epoxy resin, phenol resin, polyamide resin, polyimide resin, unsaturated polyester resin, polyphenylenether resin, polyphenylenesulfide resin, or benzocyclobutene (BCB). The thickness of the organic planarizing layer may preferably be about 100 nanometers to about 200 nanometers. In this specific example, the organic planarizing layer 112 may be about 100 nanometers.

Anti-reflective coating material layer 114, which may be, for example, a silicon anti-reflective layer (Si-ARC), is deposited over organic planarizing layer 112 to minimize any pattern distortion due to reflections. Anti-reflective coating material layer 114 may include materials having silicon and nitrogen, silicon and oxygen, or silicon, oxygen and nitrogen, or an organic polymer, or combinations thereof. The thickness of the anti-reflecting coating material layer 114 may preferably be about 300 Å to about 800 Å. As is known, a layer of photo resist 116 protecting the underlying layers in the direction of etching during the subsequent etch processing, is deposited over the anti-reflective coating material layer 114. The thickness of the photo resist 116 may preferably be about 100 nanometers or below. The layer of photo resist 116 also defines the openings through which the etch process proceeds and may include, for example, organic photo resist materials, non-organic materials or combinations thereof.

Figure 2:
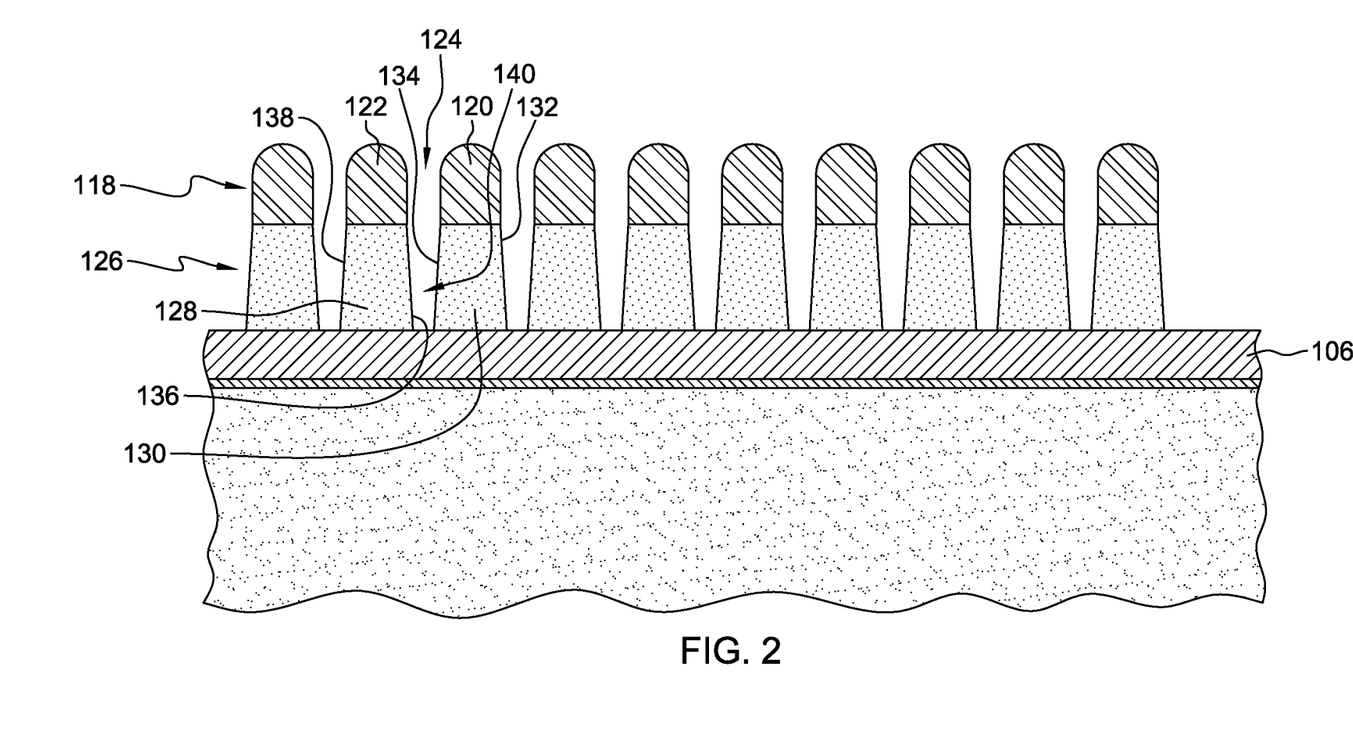
FIG. 2 depicts one example of the intermediate structure of FIG. 1 after patterning of the tapered sacrificial layer, in accordance with one or more aspects of the present invention.

As will subsequently be explained in greater detail, the invention seeks to pattern the dummy gate material of the sacrificial layer 108 into trapezoidal shaped intermediate features having a relatively large critical dimension. The trapezoidal shaped intermediate features may further have vertically tapered outer sidewalls with a relatively wide tapered sidewall angle and may be separated by extended spaces as shown in FIG. 2 and subsequently described. The relatively large size of the intermediate features allows them to be patterned without approaching the current limits of photolithographic tools. The extended spaces between the intermediate features are filled with a filler material, which will eventually become mandrels having relatively large critical dimensions. The relatively large size of the mandrel further allows improved patterning without the inherent limitations of the subsequent photolithographic techniques. The intermediate features separated by the filler material, are then etched to remove a center portion of the gate material to form sidewall spacers having a rough triangular shape with vertically tapered outer sidewalls and vertically tapered inner sidewalls separated by the mandrels formed from the filler material. The mandrels with a bigger critical dimension are then removed, leaving behind the roughly triangular shaped sidewall spacers that are twice the number of the intermediate features created. The group of sidewall spacers are then used as a hard mask to etch the underlying hard mask layer to create a deep trench isolation and rectangular spacers in the hard mask layer.

As noted above and shown in FIG. 2, the lithographic stack 110 of FIG. 1 may be exposed to print lines 118, e.g., lines 120 and 122, separated by spaces (e.g., space 124) on the organic planarizing layer 112. This exposure through the lithographic stack 110 may be performed as one or more process steps, and is used to transfer a pattern from the photo resist layer 116 to the organic planarizing layer 112 while proceeding through the anti-reflective coating layer 114. The transfer of the pattern results in the formation of the lines 118 on the organic planarizing layer. Subsequently, the photo resist, anti-reflective coating and a portion of the organic planarizing layer lying in spaces 124 between the lines are removed. Note that one or more process steps including, for example, an anti-reflective coating open step and an organic planarizing layer open step, may be utilized at this stage.

Continuing with FIG. 2, the lines 118 created in the organic planarizing layer may be used as a hard mask to transfer the lines to the sacrificial layer 108 by downwardly extending the spaces 124 between the lines to the hard mask 106, creating extended spaces 140. The downward extension of the spaces creates intermediate features 126, e.g., features 128 and 130, having vertically tapered outer sidewalls, e.g., sidewalls 132, 134, 136 and 138. Such a transfer of the lines into the sacrificial layer may be achieved by a variety of means, for example, wet etching or dry etching. In particular, etching, for example, dry-etching, may be performed to extend the OPL layer spaces 124 to the spaces 140 in the sacrificial layer, stopping at hard mask 106, thereby creating intermediate features 126. In one example, the dry etching may be performed using etching chemistries employing combinations of passivation gases, for example, sulfur hexafluoride ($SF_6$), nitrogen ($N_2$) and difluoromethane ($CH_2F_2$) in presence of helium (He). As is understood in the art, sulfur hexafluoride ($SF_6$) may act as a source of etchant species, for example, atomic fluorine (F), and contribute to isotropic etching of the sacrificial layer, for example, amorphous silicon, in the present invention. The presence of difluoromethane ($CH_2F_2$) and $N_2$ allows profile and dimension control by forming a thin polymer on the sidewalls 132, 134, 136 and 138, which "passivates" the sidewall against excessive lateral etching by the etchant species. By adjusting the relative concentrations of components in the gas mixture, different degrees of passivation and etching can be achieved, thereby allowing profile and dimension control to be tailored as desired. As is understood in the art, passivation renders the sidewalls 132, 134, 136 and 138 less chemically reactive to further etching.

Figure 3:
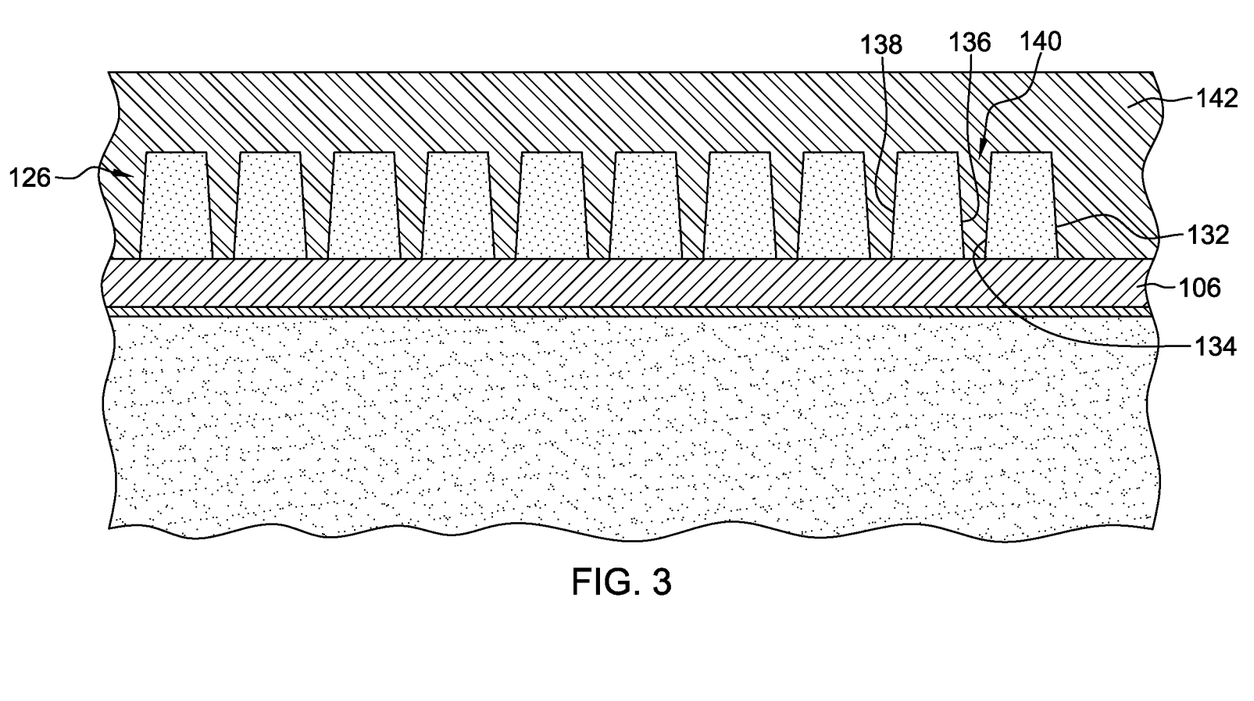
FIG. 3 depicts one example of the intermediate structure of FIG. 2 after deposition of a filler material over the tapered sacrificial layer, in accordance with one or more aspects of the present invention.

As illustrated in FIG. 3, the lines 118 created on the organic planarizing layer 112 are removed by an etching process to expose the intermediate features 126 formed from the sacrificial layer 108 of the dummy gate material, by performing any of a variety of etching processes, including wet etching and dry etching, for example, reactive ion etching, plasma etching and ion beam milling. A filler material 142 is conformally deposited in the extended spaces 140 between the vertically tapered outer sidewalls 132, 134, 136 and 138 and above the intermediate features. The filler material 42 may include a material with flow characteristics that can provide consistent fill of a gap, such as, for example, a flowable oxide, and is substantially different in composition from the material of sacrificial layer 108. In one example, flowable oxide may include a material, for example, flowable oxide film formed of, e.g., silicon oxide (Si—N—H—C—O or Si—N—H—O) having at least one of N, H and C as impurities, and the flowable oxide may be deposited by a flowable chemical vapor deposition method (F-CVD). The thickness of the filler material 142 above the intermediate features may be, for example, such as to allow for subsequent planarization. In an alternate example, the filler material 142 may include an organic material similar to the material used for the organic planarizing layer 112, as discussed with respect to FIG. 1. It may also be noted that the process of using the filler material as mandrels for the dummy gate material sidewall spacers such as, for example, flowable oxide, may be more cost effective than the CVD process conventionally used.

Figure 4:
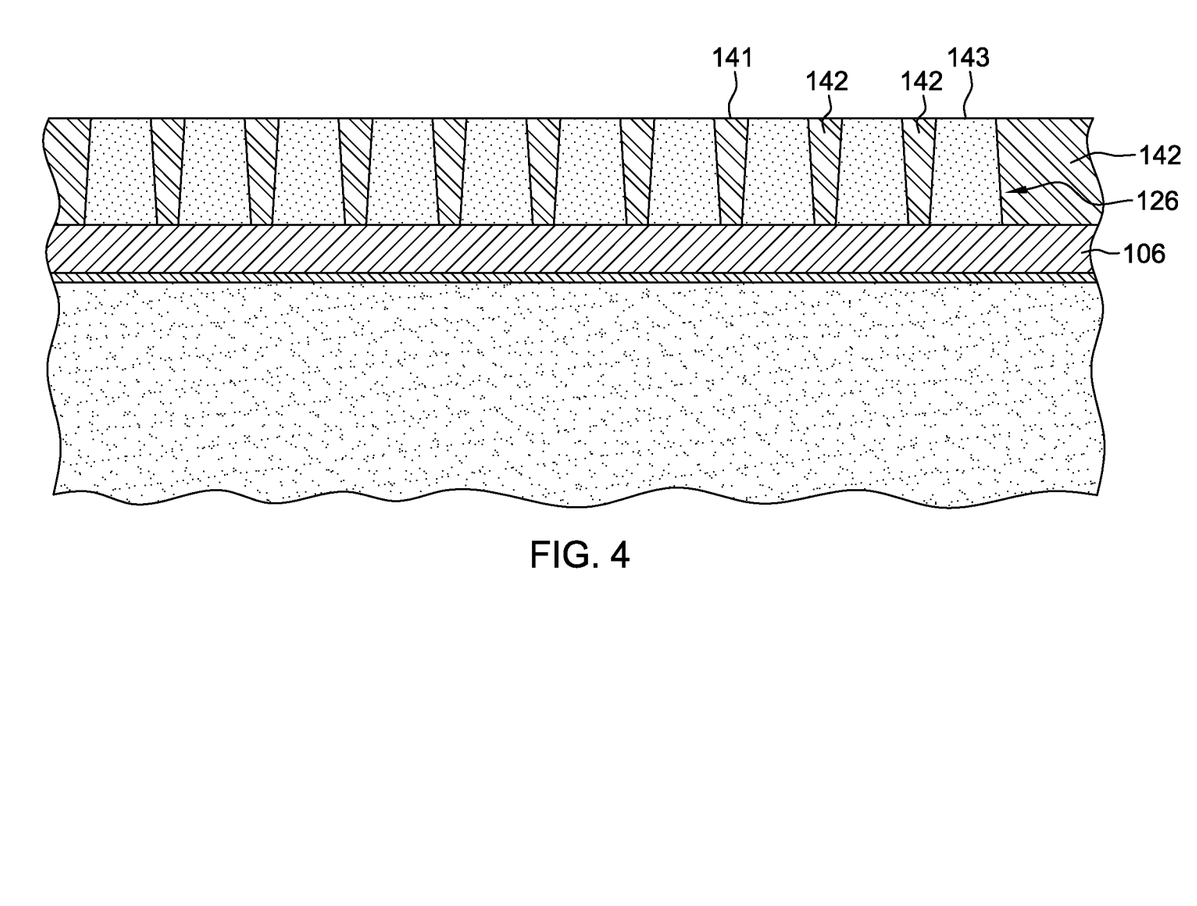
FIG. 4 depicts one example of the intermediate structure of FIG. 3 after removal of excess filler material over the tapered sacrificial layer, in accordance with one or more aspects of the present invention.

As illustrated in FIG. 4, the excess filler material 142 has been selectively removed using the gate material of the intermediate features 126 as an etch stop. The removal of the excess filler material may be performed using a conventional process, such as, for example, an etching process, to create a relatively planar surface 141 with the intermediate features 126 and leaving the filler material 142 in the extended spaces. Although polishing, such as, for example, chemical mechanical polishing, may be performed, an etching process may better facilitate controlled etching to expose the upper surfaces of the intermediate features 126, e.g., surface 143 of feature 128, upon which the etching process may be stopped. Examples of common etching processes include dry etching processes, such as, for example, reactive ion etching involving fluorine-based chemistry using process gases, such as, for example, tetrafluoromethane ($CF_4$), trifluoromethane ($CHF_3$), difluoromethane ($CH_2F_2$), fluoromethane ($CH_3F$), octofluorocyclobutane ($C_4F_8$), hexafluoro-1,3-butadiene ($C_4F_6$) and oxygen.

Figure 5:
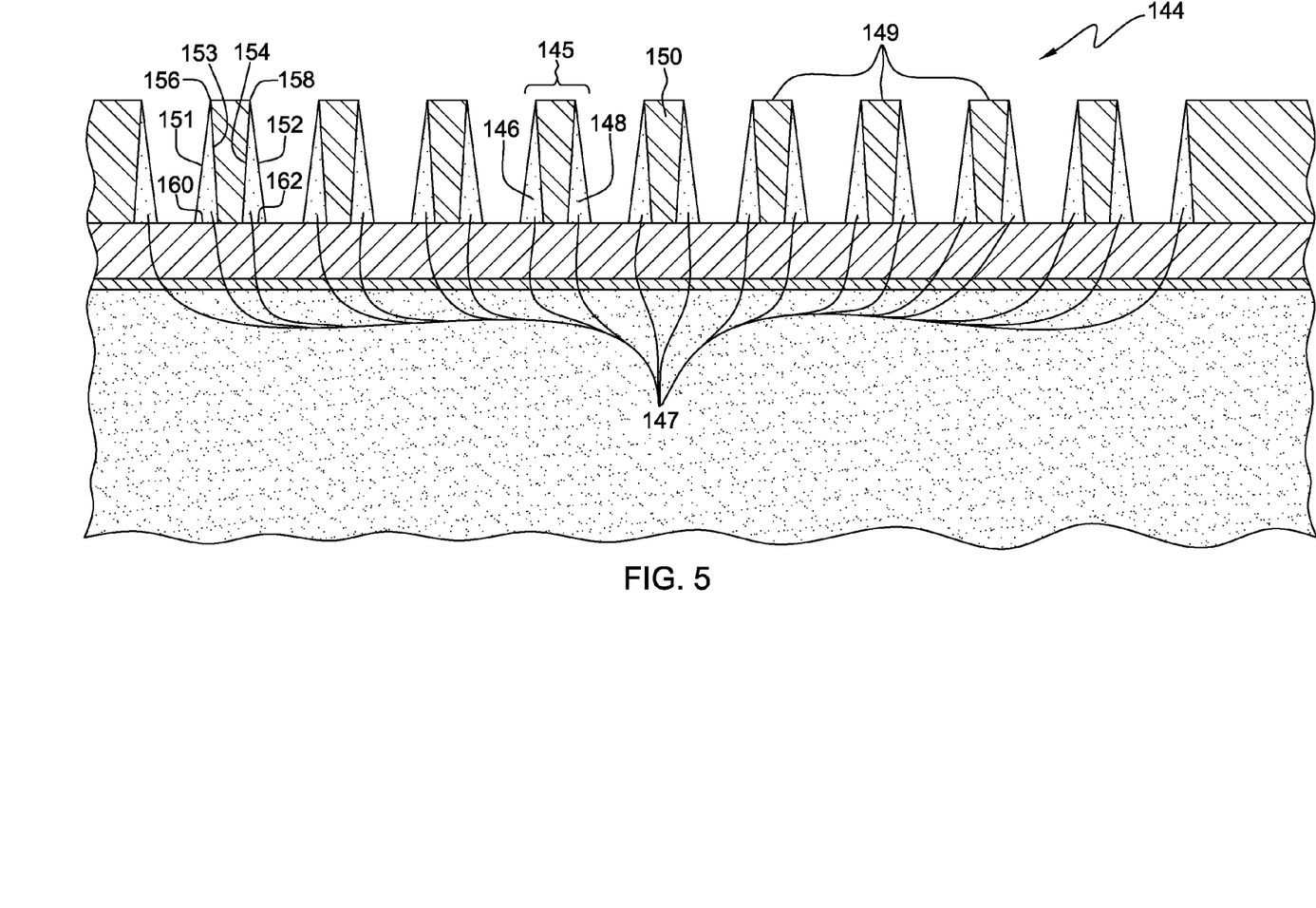
FIG. 5 depicts one example of the intermediate structure of FIG. 4 after patterning sidewall spacers from the tapered sacrificial layer and the mandrels from the filler material, in accordance with one or more aspects of the present invention.

As depicted in FIG. 5, inner portions of the dummy gate material present in the intermediate features 126 are removed to create intermediate features 144, e.g., intermediate feature 145. Each feature has a mandrel (e.g., mandrel 150) and two sidewall spacers (e.g., sidewall spacers 146 and 148). The sidewall spacers created, e.g., sidewall spacers 146 and 148, may each have vertically tapered outer sidewalls 151 and 152 and vertically tapered inner sidewalls 153 and 154 with the vertically tapered inner sidewalls being adjacent to the corresponding mandrel 150 formed from the filler material 142. The process operations may employ dry etch conditions similar to the dry etch conditions performed to create the vertically tapered outer sidewalls, as discussed with respect to FIG. 2. In one example, the dry etching may be performed using etching chemistries employing combinations of passivation gases, such as, for example, sulfur hexafluoride ($SF_6$), nitrogen ($N_2$) and difluoromethane ($CH_2F_2$) in presence of helium (He). The resultant profile of the sidewall spacers having vertically tapered outer sidewalls and vertically tapered inner sidewalls may have rough triangular shapes with pointed tips 156 and 158 and broad bases 160 and 162.

Figure 6:
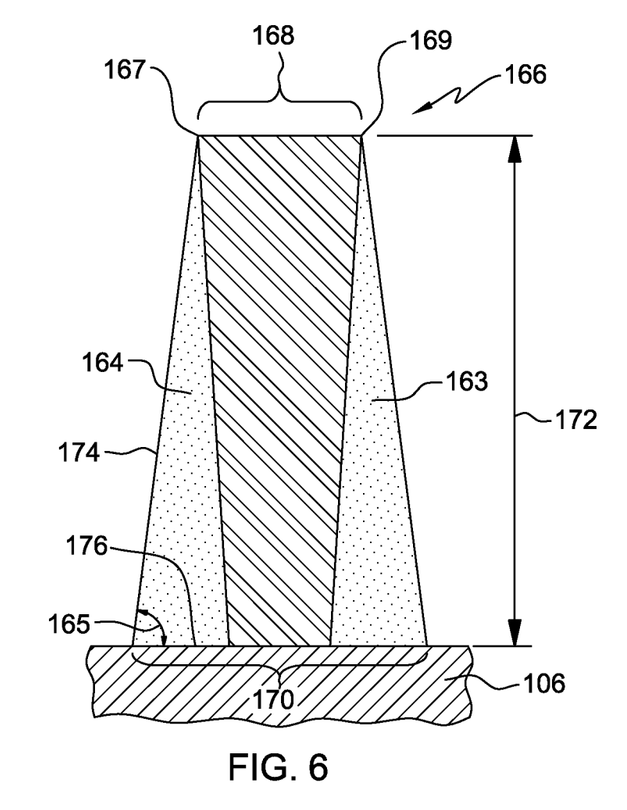
FIG. 6 depicts one example of an individual sub-structure of FIG. 5, including a mandrel and associated sidewall spacers, for use in determining a sidewall angle of the sidewall spacers, in accordance with one or more aspects of the present invention.

As shown in FIG. 6 and understood in the art, the critical angle 165 of the tapered sidewall for the intermediate features 144 of FIG. 5, formed between side 174 of sidewall spacer 164 and a base 176 of spacer 164, under which is the hard mask layer 106, may be calculated from the distance 168 between the pointed tips (167, 169) of a pair of sidewall spacers; the distance 170 of length of the bases, including the bases of the sidewall spacers and the mandrel, and the distance 172 between the bases and the pointed tips. In the present example, the critical angle 165 is between about 80° and about 85°. In general, the sidewall angle 165 is denoted as θ, θ can be measured by the formula, $$\tan\theta = \frac{\text{distance between the bases and the pointed tips}(172)}{\frac{1}{2} * \left( \begin{array}{l} \text{distance between the bases}(170) - \\ \text{distance between the pointed tips}(168) \end{array} \right)}$$

Figure 7:
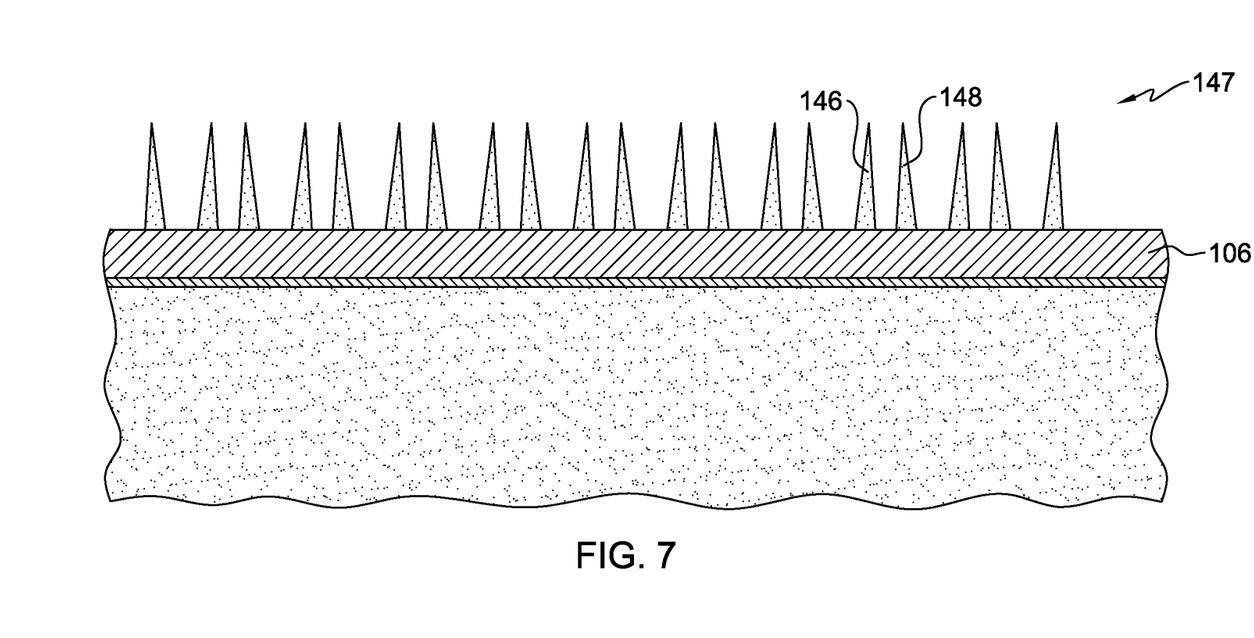
FIG. 7 depicts one example of the intermediate structure of FIG. 5 after removal of the mandrels leaving roughly triangular shaped sidewall spacers, in accordance with one or more aspects of the present invention.
Figure 8:
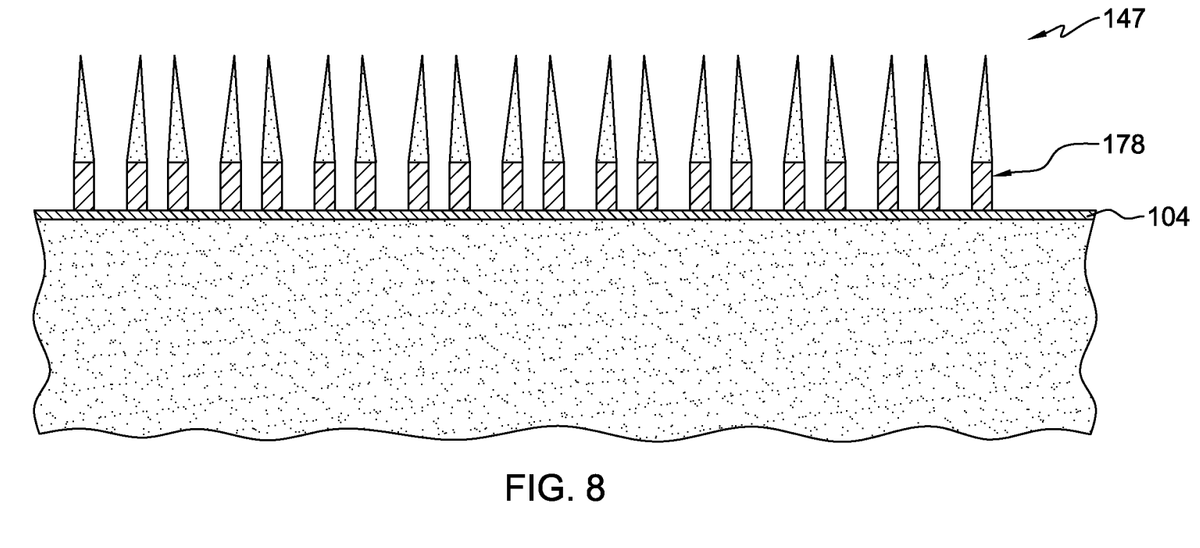
FIG. 8 depicts one example of a resultant structure obtained after FIG. 6 after the patterning of the underlying dielectric layer, resulting from using the sidewall spacers as hard mask, in accordance with one or more aspects of the present invention.

As depicted in FIG. 7, the mandrels 149 of FIG. 5 are removed, leaving sidewall spacers 147, e.g., sidewall spacers 146 and 148, that may be used a as hard mask in subsequent processing. The mandrels 149 may be removed using a variety of conventional processes, such as, for example, dry etching, e.g., reactive ion etching involving fluorine-based chemistry using process gases, such as, for example, tetrafluoromethane ($CF_4$), trifluoromethane ($CHF_3$), difluoromethane ($CH_2F_2$), fluoromethane ($CH_3F$), octofluorocyclobutane ($C_4F_8$), hexafluoro-1,3-butadiene ($C_4F_6$) and oxygen. As previously noted, the number of sidewall spacers 147 created is twice the number of lines 118 (see FIG. 2) created via the lithographic stack of FIG. 1, hence, the term "double patterning."

As shown in FIG. 7, the sidewall spacers 147 may be used as a hard mask to etch features below. In the present example, the hard mask is used to create new spacers 178 out of the underlying hard mask layer 106, for further processing. The etching may be performed using a variety of conventional processes, including, for example, dry-etching processes, e.g., reactive ion etching, or wet etching process. The resultant profile of the new spacers 178 formed out of the underlying hard mask layer 106 are roughly rectangularly shaped, due to the triangular shape of sidewall spacers 147, to facilitate the deep trench isolation.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing an intermediate semiconductor structure, the structure comprising a semiconductor substrate and a sacrificial layer of a dummy gate material above the substrate; and
   creating sidewall spacers in the sacrificial layer, the creating comprising vertically tapering inner and outer sidewalls, such that the sidewall spacers have a rough triangular shape with a pointed tip.

2. The method of claim 1, wherein the intermediate semiconductor structure further comprises a layer of a hard mask material over the semiconductor substrate and directly under the sacrificial layer, the method further comprising patterning the layer of the hard mask material using the sidewall spacers as a hard mask.

3. The method of claim 1, wherein the intermediate semiconductor structure further comprises:
   a layer of a hard mask material over the substrate;
   the sacrificial layer of the dummy gate material situated on the hard mask layer; and
   a lithographic stack over the sacrificial layer for use in creating the sidewall spacers.

4. The method of claim 3, wherein creating the sidewall spacers comprises:
   exposing the lithographic stack to print lines above the sacrificial layer, the lines separated by spaces;
   etching the sacrificial layer to extend the spaces through the sacrificial layer stopping at the layer of hard mask material to create intermediate features having vertically tapered outer sidewalls adjacent the extended spaces;
   filling the extended spaces between the vertically tapered outer sidewalls with a filler material;
   etching the intermediate features to create sidewall spacers from the dummy gate material and mandrels from the filler material, the etching comprising vertically tapering inner sides of the sidewall spacers, resulting in the sidewall spacers having the rough triangular shape and pointed tip; and
   removing the mandrels.

5. The method of claim 4, wherein a number of the sidewall spacers created is twice that of a number of the lines created.

6. The method of claim 4, wherein the semiconductor substrate comprises silicon, wherein the hard mask material comprises silicon nitride (SiN), and wherein the intermediate semiconductor structure further comprises an oxide layer between the silicon substrate and the hard mask material.

7. The method of claim 4, wherein the dummy gate material of the sacrificial layer comprises one of polycrystalline silicon and amorphous silicon, and wherein the filler material comprises a flowable oxide.

8. The method of claim 4, wherein the filling comprises:
   conformally depositing the filler material in the spaces and above the gate material; and
   etching the filler material using the gate material as a stop.

9. The method of claim 4, wherein the lithographic stack comprises:
   an organic planarizing layer (OPL);
   an antireflective coating material layer over the OPL;
   a layer of photo resist above the layer of antireflective coating material; and
   wherein the lines comprise the OPL.

10. The method of claim 4, wherein etching the sacrificial layer to create vertically tapered outer sidewalls comprises performing a plurality of etches with increasing sidewall passivation.

11. The method of claim 4, wherein the intermediate features of the dummy gate material have a critical angle of about 80° to about 85°.

12. An intermediate semiconductor structure, the structure comprising:
   a semiconductor substrate; and
   a hard mask above the semiconductor substrate, the hard mask comprising a plurality of sidewall spacers made of a dummy gate material, the plurality of sidewall spacers each having vertically tapered inner and outer sidewalls providing a rough triangular shape with a pointed tip.

13. The intermediate semiconductor structure of claim 12, wherein the gate material comprises one of polycrystalline silicon and amorphous silicon.

14. The intermediate semiconductor structure of claim 12, further comprising a layer of a hard mask material over the semiconductor substrate and immediately under the hard mask, wherein the hard mask is used to pattern the layer of hard mask material.

15. The intermediate semiconductor structure of claim 14, wherein the hard mask comprises one of one of polycrystalline silicon and amorphous silicon, and wherein the layer of hard mask material comprises silicon nitride.

16. The intermediate semiconductor structure of claim 12, wherein the plurality of sidewall spacers each has a critical angle of about 80 degrees to about 85 degrees.

\* \* \* \* \*

UNITED STATES PATENT AND TRADEMARK OFFICE
CERTIFICATE OF CORRECTION

Page 1 of 1

PATENT NO. : 8,969,205 B2
APPLICATION NO. : 13/852496
DATED : March 3, 2015
INVENTOR(S) : Shen et al.

It is certified that error appears in the above-identified patent and that said Letters Patent is hereby corrected as shown below:

IN THE CLAIMS:

Column 7, Line 37: Claim 1, Delete "tip." and insert -- tip and the inner and outer sidewalls each have an angle of less than 90 degrees with respect to a bottom surface of the sidewall spacers. --

Column 8, Line 44: Claim 12, Delete "tip." and insert -- tip and the inner and outer sidewalls each have an angle of less than 90 degrees with respect to a bottom surface of the sidewall spacers. --

Signed and Sealed this
Fourth Day of August, 2015

Michelle K. Lee
*Director of the United States Patent and Trademark Office*